(12) United States Patent
Sun

(10) Patent No.: US 12,336,219 B2
(45) Date of Patent: Jun. 17, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Yumeng Sun, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 415 days.

(21) Appl. No.: 17/663,185

(22) Filed: May 12, 2022

(65) Prior Publication Data
US 2023/0010950 A1    Jan. 12, 2023

Related U.S. Application Data

(63) Continuation of application No. PCT/CN2022/076311, filed on Feb. 15, 2022.

(30) Foreign Application Priority Data

Jul. 8, 2021 (CN) .......................... 202110775010.2

(51) Int. Cl.
*H10D 30/63* (2025.01)
*H10D 30/01* (2025.01)
*H10D 62/17* (2025.01)

(52) U.S. Cl.
CPC ........... *H10D 30/63* (2025.01); *H10D 30/025* (2025.01); *H10D 62/292* (2025.01)

(58) Field of Classification Search
CPC ............. H01L 29/7827; H01L 29/1037; H01L 29/66666; H10D 30/63; H10D 62/292; H10D 30/025
See application file for complete search history.

(56) References Cited

U.S. PATENT DOCUMENTS 4,975,383 A * 12/1990 Baglee ............... G11C 16/0441
                                                                 438/258
5,045,490 A *  9/1991 Esquivel ............... H10B 69/00
                                                                 257/E29.13

(Continued)

FOREIGN PATENT DOCUMENTS

CN     107819031 A     3/2018
CN     109524468 A     3/2019

(Continued)

OTHER PUBLICATIONS

International Search Report cited in PCT/CN2022/076311 mailed Apr. 13, 2022, 9 pages.

*Primary Examiner* — Richard A Booth
(74) *Attorney, Agent, or Firm* — Kilpatrick Townsend & Stockton LLP

(57) ABSTRACT

Embodiments of the present disclosure belong to the technical field of semiconductor structure manufacturing, and specifically provide a semiconductor structure and a manufacturing method thereof. The manufacturing method specifically includes: a first gate structure on a substrate, a first conductive region and a second conductive region, wherein the first conductive region and the second conductive region are located at two sides of the first gate structure, and in a direction perpendicular to the substrate, the first conductive region and the second conductive region are located at different height positions.

10 Claims, 8 Drawing Sheets

(56) References Cited

U.S. PATENT DOCUMENTS

| | | | |
|---|---|---|---|
| 6,372,564 B1 * | 4/2002 | Lee | H10B 41/23 |
| | | | 438/257 |
| 10,629,702 B2 | 4/2020 | Bi et al. | |
| 10,790,278 B2 | 9/2020 | Kim et al. | |
| 11,411,124 B2 | 8/2022 | Kim et al. | |
| 2006/0033147 A1 | 2/2006 | Tang | |
| 2008/0087940 A1 * | 4/2008 | Chae | H01L 29/66833 |
| | | | 257/E21.423 |
| 2009/0148992 A1 | 6/2009 | Oyu | |

FOREIGN PATENT DOCUMENTS

| | | |
|---|---|---|
| CN | 110235224 A | 9/2019 |
| CN | 110718547 A | 1/2020 |
| CN | 111900206 A | 11/2020 |

* cited by examiner

SEMICONDUCTOR STRUCTURE AND MANUFACTURING METHOD THEREOF

CROSS-REFERENCE TO RELATED APPLICATIONS

The present application is a continuation application of International Patent Application No. PCT/CN2022/076311, titled "SEMICONDUCTOR STRUCTURE AND MANUFACTURING METHOD THEREOF" and filed on Feb. 15, 2022, which claims the priority to Chinese Patent Application No. 202110775010.2, titled "SEMICONDUCTOR STRUCTURE AND MANUFACTURING METHOD THEREOF" and filed with China National Intellectual Property Administration (CNIPA) on Jul. 8, 2021. The entire contents of International Patent Application No. PCT/CN2022/076311 and Chinese Patent Application No. 202110775010.2 are incorporated herein by reference.

TECHNICAL FIELD

Embodiments of the present disclosure relate to the technical field of semiconductor manufacturing, and in particular to a semiconductor structure and a manufacturing method thereof.

BACKGROUND

A semiconductor structure includes a metal oxide semiconductor field effect transistor (MOSFET) for switching, amplification and so on. In the related art, due to a short channel structure between a source and a drain in the MOSFET transistor, there is serious electric leakage of the MOSFET transistor.

SUMMARY

According to an aspect, an embodiment of the present disclosure provides a semiconductor structure, including:

a first gate structure on a substrate, a first conductive region and a second conductive region, where the first conductive region and the second conductive region are located at two sides of the first gate structure, and in a direction perpendicular to the substrate, the first conductive region and the second conductive region are located at different height positions.

According to another aspect, an embodiment of the present disclosure further provides a manufacturing method of a semiconductor structure, including:

providing a substrate;

forming a first conductive region, the first conductive region being located on the substrate, and the first conductive region and a preset surface of the substrate being located at different height positions;

forming a first gate structure, the first gate structure being located on the preset surface at one side of the first conductive region; and forming a second conductive region, the second conductive region extending toward an inside of the substrate from the preset surface at one side of the first conductive region, and a projection of the first conductive region on the preset surface falling beyond the second conductive region.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and those of ordinary skill in the art may still derive other drawings from these drawings without creative efforts.

DETAILED DESCRIPTION

Figure 1:
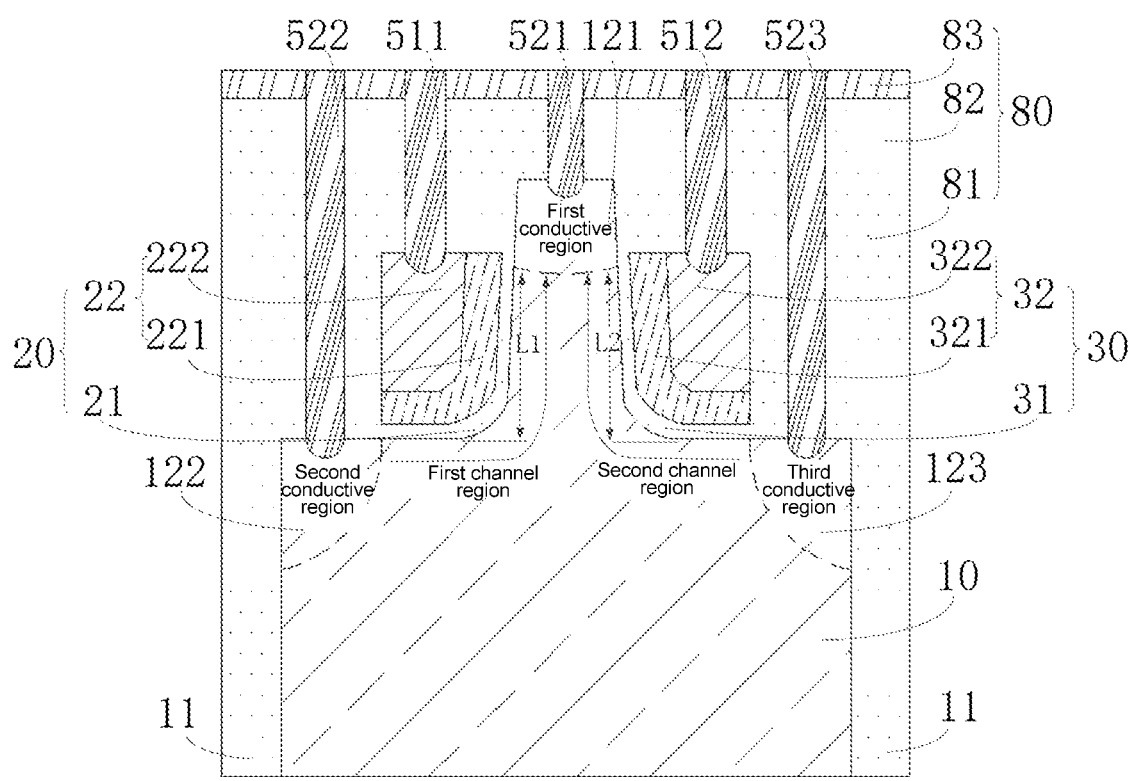
FIG. 1 is a schematic cross-sectional view of a semiconductor structure according to an embodiment of the present disclosure.

Exemplary embodiments are described in detail herein, and examples thereof are represented in the accompanying drawings. When the following descriptions relate to the accompanying drawings, unless otherwise stated, same numerals in different accompanying drawings represent same or similar elements. Implementations described in the following exemplary embodiments do not represent all implementations consistent with the present disclosure. On the contrary, the implementations are merely examples of apparatuses and methods that are described in detail in the appended claims and consistent with some aspects of the present disclosure.

The terms "includes" and "has" in the present disclosure are used to indicate an open-ended inclusion and to mean that additional elements/components/and the like may exist in addition to the listed elements/components/and the like. The terms "first", "second", and the like are merely used as markers, not as quantitative restrictions on objects thereof. In the present disclosure, in the absence of any description to the contrary, orientation terms such as "upper, lower, left, right" are usually used to indicate the upper, lower, left, and right as shown in the accompanying drawings. The "inside and outside" refers to the inside and outside relative to contour of each component. It can be understood that the above orientation terms represent relative terms and are used in this specification for convenience only, for example, according to orientations in the examples described in the accompanying drawings, if a device of an icon is turned upside down, the components described as "upper" will become the "lower" components. In the accompanying drawings, shapes shown can be deformed depending on a manufacturing process and/or a tolerance. Therefore, the exemplary implementations of the present disclosure are not limited to the particular shapes illustrated in the accompanying drawings and may include changes in shape caused during a manufacturing process. In addition, the different elements and regions in the accompanying drawings are shown schematically only, and therefore the present disclosure is not limited to the sizes or distances shown in the accompanying drawings.

To clearly understand the technical solutions of the present disclosure, detailed descriptions are first made to the related technical solutions.

In the related art, an MOSFET transistor (or an MOS transistor or a transistor) includes a gate on a surface of a substrate as well as a source and a drain that are spaced apart. A projection of the gate on the substrate falls between the source and the drain. When an appropriate voltage is applied to the gate, a conductive channel structure can be formed between the source and the drain. With the constant development of integrated circuits (ICs), there are a smaller device size and a shorter channel structure between the source and the drain to cause electric leakage of the semiconductor structure easily.

In view of the above problem, embodiments of the present disclosure provide a semiconductor structure and a manufacturing method thereof. A first conductive region and a second conductive region are located at two sides of the first gate structure, and in a direction perpendicular to a substrate, the first conductive region and the second conductive region are located at different height positions. Compared with a distance between the first conductive region and the second conductive region in a direction parallel to the surface of the substrate, the first channel region is longer to reduce the electric leakage of the semiconductor structure and improve the performance of the semiconductor structure.

Detail descriptions on the technical solutions of the present disclosure and how to solve the above technical problem will be described below with specific embodiments. The following specific embodiments may be combined with each other, and the same or similar concepts or processes may not be repeatedly described in some embodiments. The embodiments of the present disclosure will be described in detail below with reference to the drawings.

Exemplarily, the semiconductor structure may be a dynamic random access memory (DRAM). The DRAM includes a transistor structure and a capacitor structure connected to the transistor structure. The capacitor structure is configured to store data. The transistor structure is configured to read data from the capacitor structure or write data to the capacitor structure. Certainly, the embodiment is not limited to the DRAM, and the semiconductor structure in the embodiment may further be other structures. The transistor structure in the semiconductor structure may be a P-type MOS transistor, and may also be an N-type MOS transistor, which is not limited herein.

As shown in FIG. 1, an embodiment of the present disclosure provides a semiconductor structure, specifically including: a first gate structure 20 on a substrate 10, a first conductive region 121 and a second conductive region 122.

The substrate 10 may be a semiconductor substrate 10 such as monocrystalline silicon, polycrystalline silicon or amorphous silicon or silicon-germanium (SiGe), and may also be a hybrid semiconductor substrate such as silicon carbide, indium antimonide, lead antimonide, indium arsenide, indium phosphide, gallium arsenide or gallium antimonide semiconductor, alloy or a combination thereof. There are no limits made thereto in the embodiment of the present disclosure.

The first gate structure 20 is located on a surface of the substrate 10. The first gate structure 20 includes a conductive layer. The conductive layer may include one or more conductive materials. The conductive layer is connected to an externally applied voltage to turn on or off the semiconductor structure. The first gate structure 20 further includes an insulating material for protecting the first gate structure 20 from damage.

The first conductive region 121 and the second conductive region 122 are located in the substrate 10, and extend toward an inside of the substrate 10 from the surface of the substrate 10. That is, the first conductive region 121 and the second conductive region 122 are located at two sides of the first gate structure 20.

Exemplarily, referring also to FIG. 1, in a direction perpendicular to the substrate 10, the first conductive region 121 and the second conductive region 122 are located at different height positions. As shown in the figure, the position of the first conductive region 121 on the surface of the substrate 10 is higher than the position of the second conductive region 122 on the surface of the substrate 10. Specifically, as shown in FIG. 1, the substrate 10 is of an "inverted-T-shaped" structure. The first conductive region 121 is located in a raised structure of the substrate 10. The first gate structure 20 is located at one side of the first conductive region 121, and the first gate structure 20 is located on the surface of the substrate 10. The second conductive region 122 is located at one side of the first gate structure 20, and the second conductive region 122 is located in a recessed structure of the substrate 10. In the embodiment, the term "raised" refers to a direction away from the inside of the substrate 10, while the term "recessed" refers to a direction close to the inside of the substrate 10.

It is to be noted that the structure in the figure is merely used as an example. In actual applications, the position of the first conductive region 121 on the surface of the substrate 10 may also be lower than the position of the second conductive region 122 on the surface of the substrate 10. For example, the substrate 10 may be of a "U-shaped" structure. The first conductive region 121 is located in a recessed structure of the substrate 10. The first gate structure 20 is located at one side of the first conductive region 121, and the first gate structure 20 is located on the surface of the substrate 10. The second conductive region 122 is located at one side of the first gate structure 20, and the second conductive region 122 is located in a raised structure of the substrate 10.

In the embodiment, the first conductive region 121 may be a source region of the semiconductor structure, and the second conductive region 122 may be a drain region of the semiconductor structure. Certainly, the first conductive region 121 may also be the drain region, and the second conductive region 122 may also be the source region. There are no limits made thereto in the embodiment.

When an appropriate voltage is applied to the first gate structure 20, a first conductive channel region can be formed between the first conductive region 121 and the second conductive region 122 and at a side close to the first gate structure 20 to implement the function of the semiconductor structure.

The semiconductor structure provided by the embodiment specifically includes: a first gate structure 20 on a substrate 10, a first conductive region 121 and a second conductive region 122. The first conductive region 121 and the second conductive region 122 are located at two sides of the first gate structure 20. In a direction perpendicular to the substrate 10, the first conductive region 121 and the second conductive region 122 are located at different height positions. When an appropriate voltage is applied to the first gate structure 20, a first conductive channel region can be formed between the first conductive region 121 and the second conductive region 122 and at a side close to the first gate structure 20. As the first conductive region 121 and the second conductive region 122 are located at the different height positions, compared with a distance between the first conductive region 121 and the second conductive region 122 in a direction parallel to the surface of the substrate 10, the first channel region is longer to reduce the electric leakage of the semiconductor structure and improve the performance of the semiconductor structure.

Further, the semiconductor structure provided by the embodiment is further helpful to reduce the device size and improve the device integration, thus further improving the performance of the device.

Optionally, the first channel region between the first conductive region 121 and the second conductive region 122 and at the side close to the first gate structure 20 is provided with a bending structure.

Exemplarily, referring to FIG. 1, the first channel region includes a horizontal structure in a direction parallel to the surface of the substrate 10 and a vertical structure in a direction perpendicular to the surface of the substrate 10. The first channel region further includes a bending structure between the horizontal part and the vertical part. With the bending structure in the first channel region, the first channel region is further longer to reduce the electric leakage of the semiconductor structure.

Optionally, a height difference L1 is formed between the first conductive region 121 and the second conductive region 122, and an absolute value of the height difference L1 is greater than zero and less than a length of the first channel region.

Exemplarily, as shown in the figure, the absolute value of the height difference L1 is a length of the vertical structure in the direction perpendicular to the surface of the substrate 10. In the embodiment where the position of the first conductive region 121 on the surface of the substrate 10 is lower than the position of the second conductive region 122 on the surface of the substrate 10, the absolute value of the height difference L1 is the length of the vertical structure in the direction perpendicular to the surface of the substrate 10. The length of the first channel region is a sum of the length of the horizontal structure, the length of the vertical structure and the length of the bending structure. Therefore, the absolute value of the height difference L1 is greater than zero and less than the length of the first channel region in the above two semiconductor structures.

Optionally, the first gate structure 20 includes a first gate conductor block 22 and a first gate dielectric layer 21. The first gate dielectric layer 21 is located between the first gate conductor block 22 and the substrate 10. The first gate dielectric layer 21 is provided with a bending structure.

Exemplarily, the first gate dielectric layer 21 covers the surface of the substrate 10. The first gate structure 20 covers the bending structure of the first channel region. The first gate dielectric layer 21 is also provided with the bending structure, so as to isolate the first channel region and the first gate conductor block 22.

Optionally, a bend in the bending structure of the first gate dielectric layer 21 has a radian of greater than 90°. Exemplarily, the bending structure of the first gate dielectric layer 21 is provided between the surface of the substrate 10 and the raised structure. The bending structure is formed in a circular arc. A central angle corresponding to the circular arc is greater than 90° to further isolate the first channel region and the first gate conductor block 22. In other examples, the bending structure may further be formed in a spline curve. A central angle corresponding to the spline curve is greater than 90°.

Optionally, the first gate dielectric layer 21 is distributed along a horizontal direction of the substrate 10 and a vertical direction of the substrate 10, and the first gate dielectric layer 21 is distributed continuously. In a possible implementation, the first gate dielectric layer 21 may be formed by coating, so as to be continuously distributed along the horizontal direction of the substrate 10 and the vertical direction of the substrate 10. The material of the first gate dielectric layer 21 may include, for example, silicon oxide, silicon nitride, silicon oxynitride, etc.

Optionally, the first gate conductor block 22 is provided with a first conductive layer 221 and a second conductive layer 222. The first conductive layer 221 is located between the second conductive layer 222 and the first gate dielectric layer 21. The material of the first conductive layer 221 may be different from that of the second conductive layer 222. In a possible implementation, the material of each of the first conductive layer 221 and the second conductive layer 222 may include, for example, titanium nitride, polycrystalline silicon, tungsten, etc.

It is to be noted that the first gate structure 20 and the second conductive region 122 are located at a left side of the first conductive region 121, as shown in the figure. The first gate structure 20, the first conductive region 121, the second conductive region 122 and the substrate 10 can be formed into a transistor structure. To further improve the integration of the semiconductor structure, a structure symmetric with respect to the first conductive region 121 may further be provided at a right side of the first conductive region 121 to form another transistor structure. Therefore, with the same area, the greater the number of transistors, the higher the integration level, and the longer the channel of the single transistor.

Optionally, the semiconductor structure provided by the embodiment of the present disclosure further includes a second gate structure 30 on the substrate 10 and a third conductive region 123. The first conductive region 121 and the third conductive region 123 are located at two sides of the second gate structure 30. In the direction perpendicular to the substrate 10, the third conductive region 123 and the first conductive region 121 are located at different height positions.

Exemplarily, referring to FIG. 1, in the direction perpendicular to the substrate 10, the first conductive region 121 and the third conductive region 123 are located at different height positions. As shown in the figure, the position of the first conductive region 121 on the surface of the substrate 10 is higher than the position of the third conductive region 123 on the surface of the substrate 10. Specifically, as shown in FIG. 1, the substrate 10 is of an "inverted-T-shaped" structure. The first conductive region 121 is located in a middle raised structure of the substrate 10. The first gate structure 20 is located at one side of the first conductive region 121, and the second gate structure 30 is located at the other side of the first conductive region 121. The second conductive region 122 is located at one side of the first gate structure 20, and the second conductive region 122 is located in a left recessed structure of the substrate 10. The third conductive region 123 is located at one side of the second gate structure 30, and the third conductive region 123 is located in a right recessed structure of the substrate 10.

In the embodiment where the position of the first conductive region 121 on the surface of the substrate 10 is lower than the position of the third conductive region 123 on the surface of the substrate 10, for example, the substrate 10 may be of a "U-shaped" structure. The first conductive region 121 is located in a middle recessed structure of the substrate 10. The first gate structure 20 is located at one side of the first conductive region 121, and the second gate structure 30 is located at the other side of the first conductive region 121. The second conductive region 122 is located at one side of the first gate structure 20, and the second conductive region 122 is located in a left raised structure of the substrate 10. The third conductive region 123 is located at one side of the second gate structure 30, and the third conductive region 123 is located in a right raised structure of the substrate 10.

In the embodiment, the first conductive region 121 may be a source region of the semiconductor structure, and the second conductive region 122 and the third conductive region 123 each may be a drain region of the semiconductor structure. Certainly, the first conductive region 121 may also be the drain region, and the second conductive region 122 and the third conductive region 123 each may also be the source region. There are no limits made thereto in the embodiment.

When an appropriate voltage is applied to the second gate structure 30, a second conductive channel region can be formed between the first conductive region 121 and the third conductive region 123 and at a side close to the second gate structure 30 to implement the function of the semiconductor structure. As the first conductive region 121 and the third conductive region 123 are located at different height positions, compared with a distance between the first conductive region 121 and the third conductive region 123 in a direction parallel to the surface of the substrate 10, the second channel region is longer to reduce the electric leakage of the semiconductor structure and improve the performance of the semiconductor structure.

Optionally, the second channel region between the third conductive region 123 and the first conductive region 121 and at the side close to the second gate structure 30 is provided with a bending structure.

Exemplarily, referring to FIG. 1, the second channel region includes a horizontal structure in a direction parallel to the surface of the substrate 10 and a vertical structure in a direction perpendicular to the surface of the substrate 10. The second channel region further includes a bending structure between the horizontal part and the vertical part. With the bending structure in the second channel region, the second channel region is further longer to reduce the electric leakage of the semiconductor structure.

Optionally, a height difference L2 is formed between the third conductive region 123 and the first conductive region 121, and an absolute value of the height difference L2 is greater than zero and less than a length of the second channel region.

Exemplarily, as shown in the figure, the absolute value of the height difference L2 is a length of the vertical structure in the direction perpendicular to the surface of the substrate 10. In the embodiment where the position of the first conductive region 121 on the surface of the substrate 10 is lower than the position of the third conductive region 123 on the surface of the substrate 10, the absolute value of the height difference L2 is the length of the vertical structure in the direction perpendicular to the surface of the substrate 10. The length of the second channel region is a sum of the length of the horizontal structure, the length of the vertical structure and the length of the bending structure. Therefore, the absolute value of the height difference L2 is greater than zero and less than the length of the second channel region in the above two semiconductor structures.

Optionally, the second gate structure 30 includes a second gate conductor block 32 and a second gate dielectric layer 31. The second gate dielectric layer 31 is located between the second gate structure 30 and the substrate 10. The second gate dielectric layer 31 is provided with a bending structure.

Exemplarily, the second gate dielectric layer 31 covers the surface of the substrate 10. The second gate structure 30 covers the bending structure of the second channel region. The second gate structure 30 is also provided with the bending structure to isolate the second channel region and the second gate conductor block 32.

Optionally, a bend in the bending structure of the second gate dielectric layer 31 has a radian of greater than 90°. Exemplarily, the bending structure of the second gate dielectric layer 31 is provided between the surface of the substrate 10 and the raised structure. The bending structure is formed in a circular arc. A central angle corresponding to the circular arc is greater than 90° to further isolate the second channel region and the second gate dielectric layer 31. In other examples, the bending structure may further be formed in a spline curve. A central angle corresponding to the spline curve is greater than 90°.

Optionally, the second gate dielectric layer 31 is distributed along a horizontal direction of the substrate 10 and a vertical direction of the substrate 10, and the second gate dielectric layer 31 is distributed continuously. In a possible implementation, the second gate dielectric layer 31 may be formed by coating, so as to be continuously distributed along the horizontal direction of the substrate 10 and the vertical direction of the substrate 10. The material of the second gate dielectric layer 31 may include, for example, silicon oxide, silicon nitride, silicon oxynitride, etc.

Optionally, the second gate conductor block 32 is provided with a third conductive layer 321 and a fourth conductive layer 322. The third conductive layer 321 is located between the fourth conductive layer 322 and the second gate dielectric layer 31. To reduce the manufacturing cost of the semiconductor structure, the material of the third conductive layer 321 may be different from that of the fourth conductive layer 322. In a possible implementation, the material of each of the third conductive layer 321 and the fourth conductive layer 322 may include, for example, titanium nitride, polycrystalline silicon, tungsten, etc.

Optionally, in the direction perpendicular to the substrate 10, the first gate structure 20, the first conductive region 121 and the second conductive region 122 are electrically connected through a first plug 511, a second plug 521 and a third plug 522, respectively. With the first plug 511, the second plug 521 and the third plug 522, the electrical signal can be transmitted to the first gate structure 20, the first conductive region 121 and the second conductive region 122 to implement the function of the semiconductor structure.

Optionally, in the direction perpendicular to the substrate 10, the second gate structure 30 and the third conductive region 123 are electrically connected through a fourth plug 512 and a fifth plug 523, respectively. With the fourth plug 512 and the fifth plug 523, the electrical signal can be transmitted to the second gate structure 30 and the third conductive region 123 to implement the function of the semiconductor structure.

Specifically, the first plug 511, the second plug 521, the third plug 522, the fourth plug 512 and the fifth plug 523 are separately inserted into the first gate structure 20, the first conductive region 121, the second conductive region 122, the second gate structure 30 and the third conductive region 123 to further improve the bonding strength of the plugs. In a possible implementation, an isolation layer 80 may be formed on the surface of the substrate 10 and on the first gate structure 20 and the second gate structure 30. Contact holes are formed in the isolation layer 80 in a penetrating manner. The contact holes are filled with a conductive material. The first plug 511, the second plug 521, the third plug 522, the fourth plug 512 and the fifth plug 523 may be formed synchronously.

Specifically, as shown in the figure, the isolation layer 80 may include a first isolation layer 81, a second isolation layer 82 and a third isolation layer 83 that are stacked. The first isolation layer 81 may cover the first gate structure 20, the second gate structure 30 and the surface of the substrate 10. The second isolation layer 82 covers the first isolation layer 81, and further covers the surface of the first conductive region. The third isolation layer 83 covers the second isolation layer 82. With the first isolation layer 81, the second isolation layer 82 and the third isolation layer 83 for isolating the semiconductor structure, the performance of the semiconductor structure is further improved. In a possible implementation, the material of the first isolation layer 81 may be the same as that of the second isolation layer 82. The material of the third isolation layer 83 may be different from that of the first isolation layer 81 and that of the second isolation layer 82. The material of each of the first isolation layer 81, the second isolation layer 82 and the third isolation layer 83 may include, for example, silicon nitride, silicon oxide, silicon oxynitride, etc.

It is to be noted that the semiconductor structure in the embodiment further includes shallow recess isolation (STI) parts 11 that are spaced in the substrate 10. The STI parts 11 are perpendicular to the surface of the substrate 10. The STI parts 11 can isolate active devices. Exemplarily, the STI parts 11 are located at a side of the second conductive region 122 away from the first gate structure 20. The STI parts 11 are further located at a side of the third conductive region 123 away from the second gate structure 30. In a possible implementation, the material of the STI parts 11 may include silicon dioxide.

On the basis of the semiconductor structure in the above embodiment, another embodiment of the present disclosure further provides a manufacturing method of a semiconductor structure. The manufacturing method of a semiconductor structure can be used to manufacture the above semiconductor structure.

Exemplarily, the semiconductor structure may be a DRAM. The DRAM includes a transistor structure and a capacitor structure connected to the transistor structure. The capacitor structure is configured to store data. The transistor structure is configured to read data from the capacitor structure or write data to the capacitor structure. Certainly, the embodiment is not limited to the DRAM, and the semiconductor structure in the embodiment may further be other structures. The transistor structure in the semiconductor structure may be a P-type MOS transistor, and may also be an N-type MOS transistor, which is not limited herein.

Figure 2:
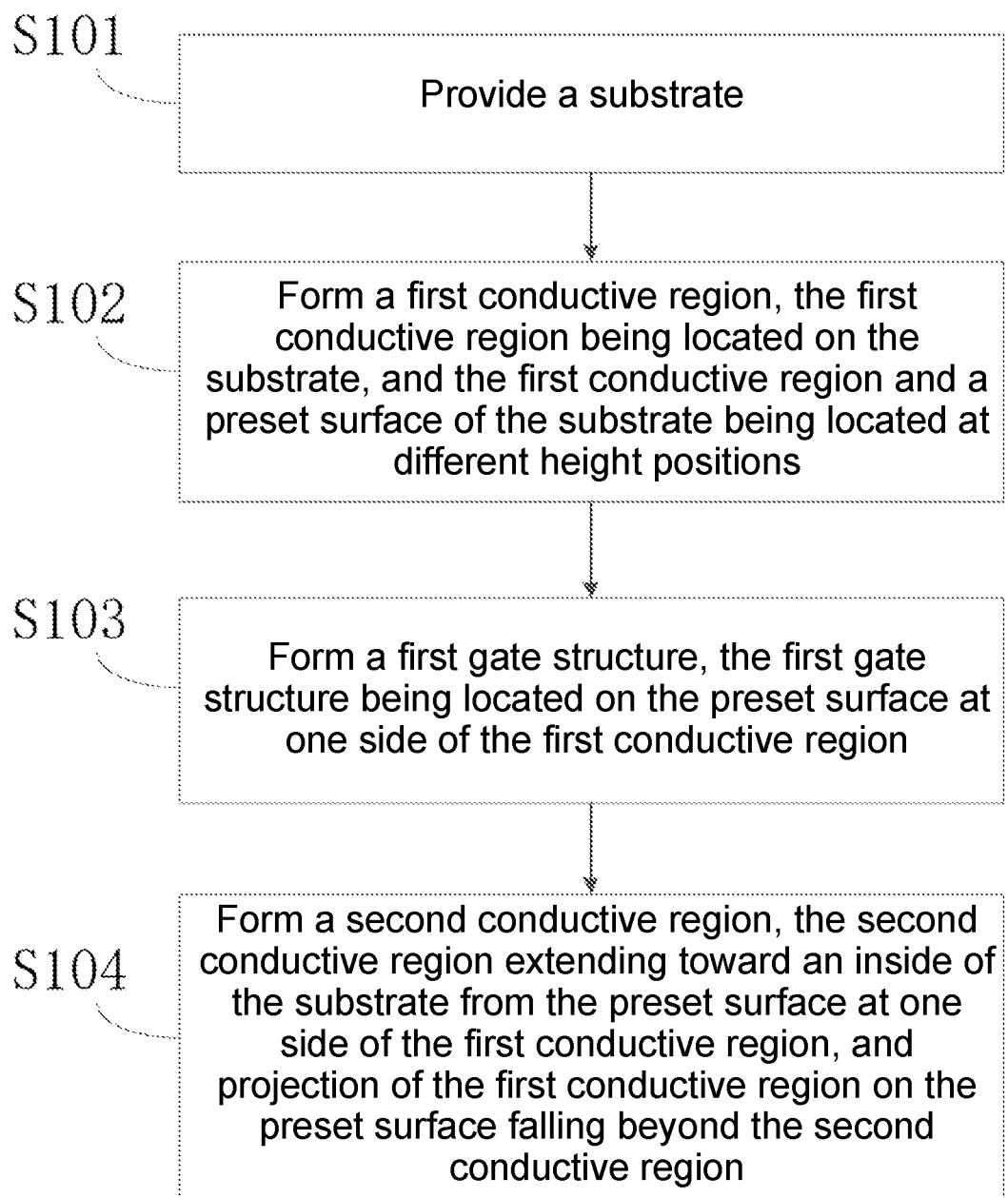
FIG. 2 is a flowchart of a manufacturing method of a semiconductor structure according to an embodiment of the present disclosure.

As shown in FIG. 2, an embodiment of the present disclosure provides a manufacturing method of a semiconductor structure, specifically including:

Step S101: Provide a substrate.

Figure 3:
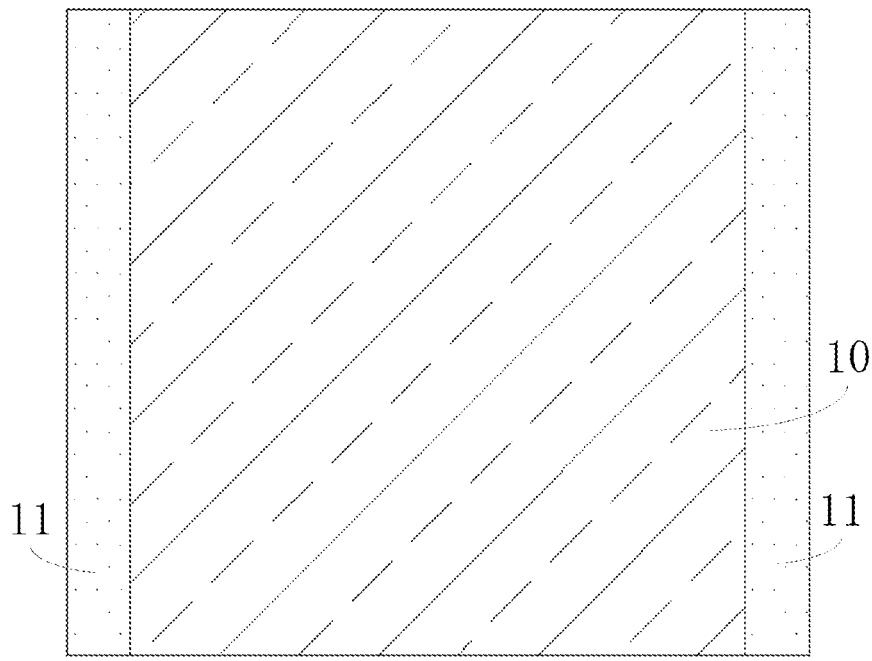
FIG. 3 is a schematic cross-sectional view of a substrate in a semiconductor structure according to an embodiment of the present disclosure.

As shown in FIG. 3, the substrate 10 may be a semiconductor substrate 10 such as monocrystalline silicon, polycrystalline silicon or amorphous silicon or silicon-germanium (SiGe), and may also be a hybrid semiconductor substrate such as silicon carbide, indium antimonide, lead antimonide, indium arsenide, indium phosphide, gallium arsenide or gallium antimonide, alloy or a combination thereof. There are no limits made thereto in the embodiment of the present disclosure.

Spaced STI parts 11 are further provided in the substrate 10. The STI parts 11 are perpendicular to the surface of the substrate 10. The STI parts 11 can isolate active devices. In a possible implementation, the material of the STI parts 11 may include silicon dioxide.

Step S102: Form a first conductive region, the first conductive region being located on the substrate, and the first conductive region and a preset surface of the substrate being located at different height positions.

Figure 4:
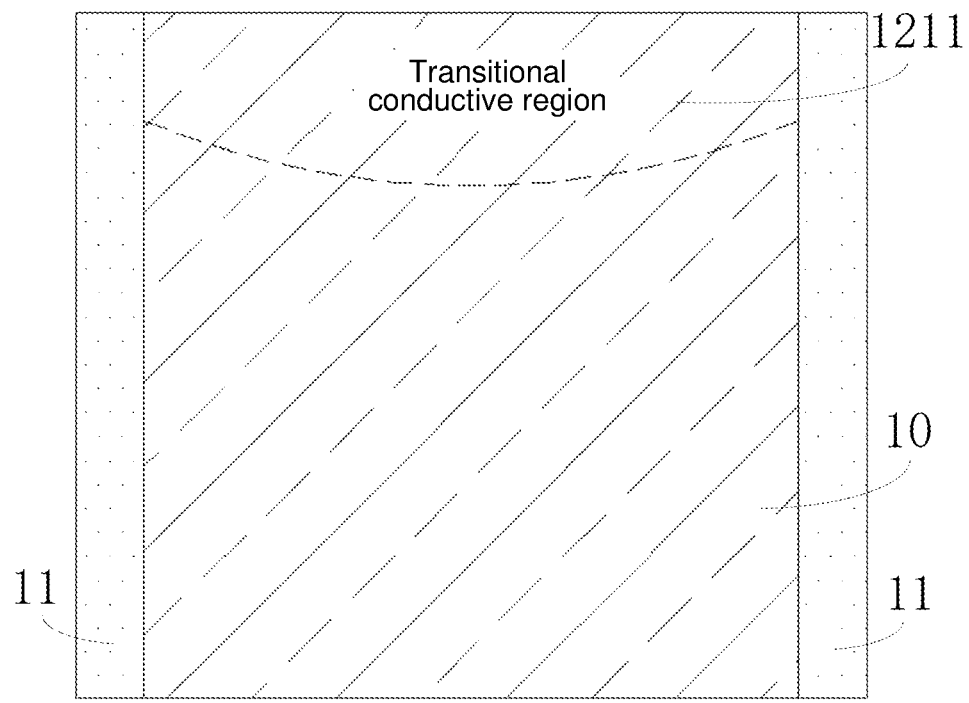
FIG. 4 is a schematic cross-sectional view of a transitional conductive region in a semiconductor structure according to an embodiment of the present disclosure.
Figure 5:
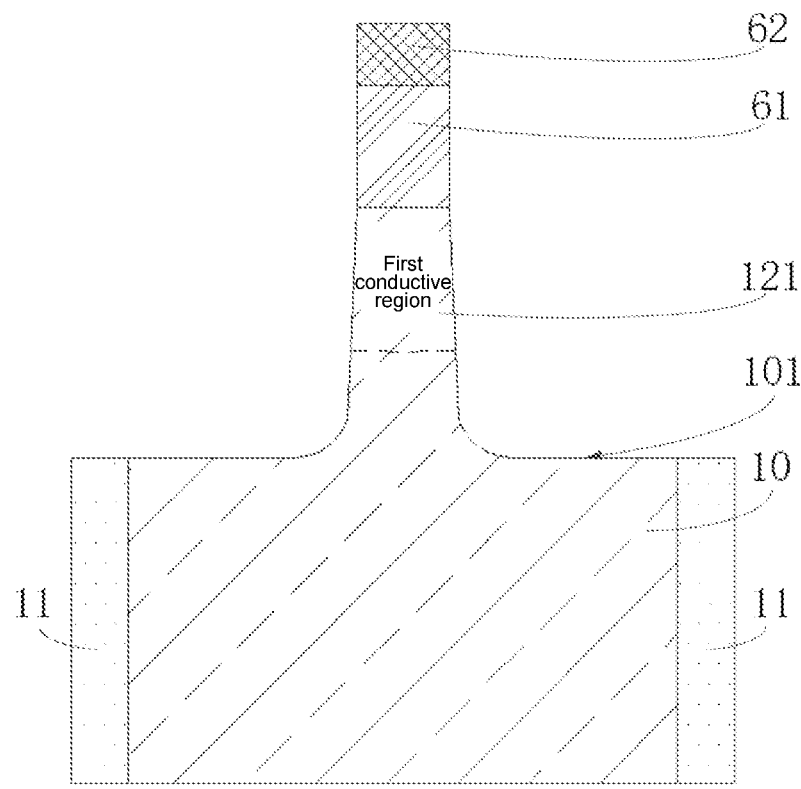
FIG. 5 is a schematic cross-sectional view of a first conductive region in a semiconductor structure according to an embodiment of the present disclosure.
Figure 6:
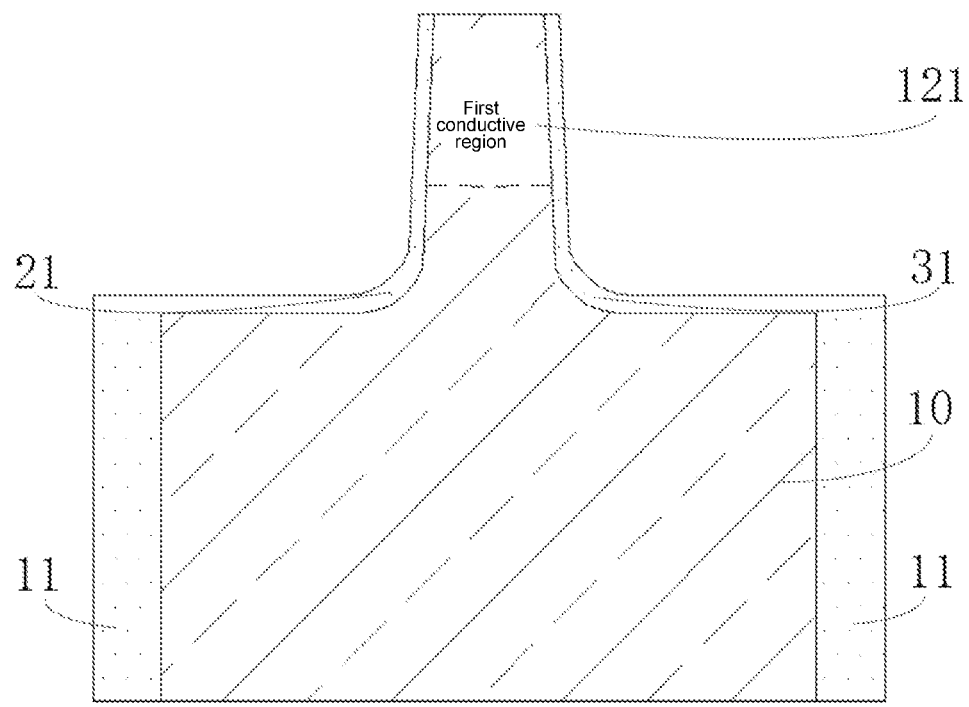
FIG. 6 is a schematic cross-sectional view of a first gate dielectric layer and a second gate dielectric layer in a semiconductor structure according to an embodiment of the present disclosure.

Exemplarily, referring to FIG. 4, FIG. 5 and FIG. 6, the preset surface 101 of the substrate 10 refers to an upper surface of the substrate 10. The first conductive region 121 is higher than the preset surface 101. Specifically, the substrate 10 is of an "inverted-T-shaped" structure. The first conductive region 121 is located in a middle raised structure of the substrate 10. In the embodiment, the term "raised" refers to a direction away from the inside of the substrate 10, while the term "recessed" refers to a direction close to the inside of the substrate 10.

In a possible implementation, ions may be implanted into a surface of the substrate 10 first and then a part of the substrate 10 may be etched to form the raised structure of the substrate 10. In another possible implementation, the raised structure may be formed on the substrate 10 first and then ions may be implanted into the raised structure to form the first conductive region 121.

It is to be noted that the structure in the figure is merely used as an example. In actual applications, the first conductive region 121 may further be lower than the preset surface 101. For example, the substrate 10 may further be of a "U-shaped" structure. The first conductive region 121 is located in a middle recessed structure of the substrate 10.

Step S103: Form a first gate structure, the first gate structure being located on the preset surface at one side of the first conductive region.

The first gate structure 20 is located on the preset surface 101. The first gate structure 20 includes a conductive layer.

The conductive layer may include one or more conductive materials. The conductive layer is connected to an externally applied voltage to turn on or off the semiconductor structure. The first gate structure 20 further includes an insulating material for protecting the first gate structure 20 from damage.

Step S104: Form a second conductive region, the second conductive region extending toward an inside of the substrate from the preset surface at one side of the first conductive region, and a projection of the first conductive region on the preset surface falling beyond the second conductive region.

Figure 8:
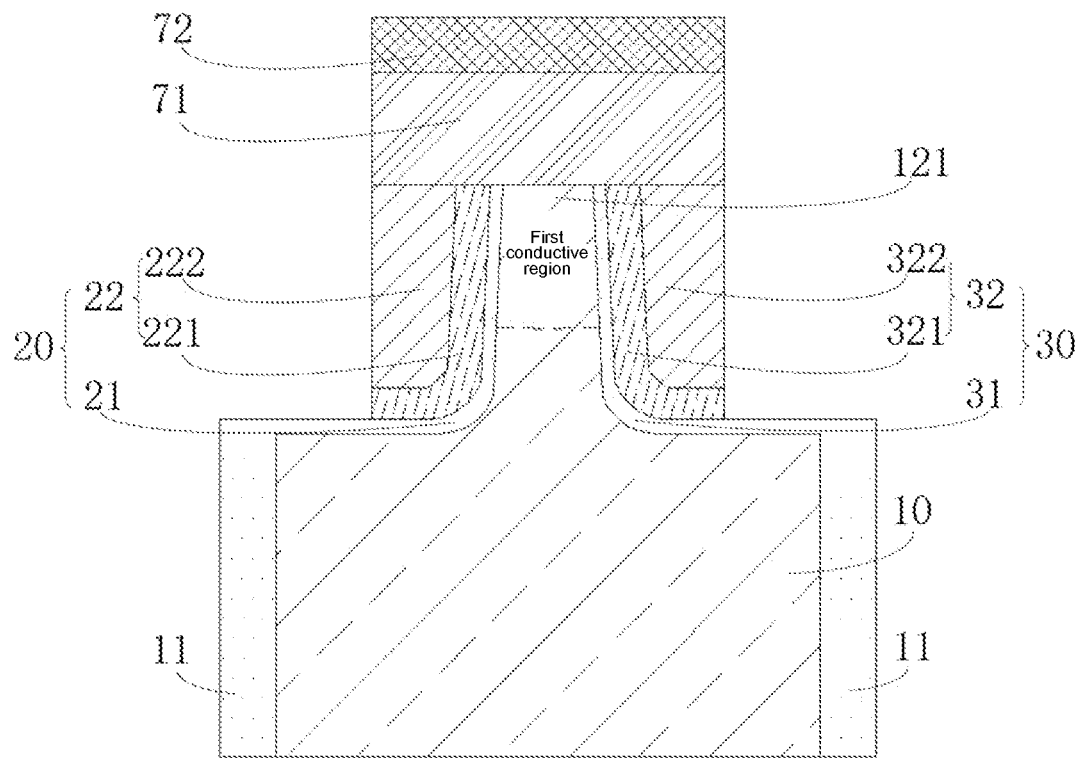
FIG. 8 is a schematic cross-sectional view after a part of a first conductive layer, a part of a second conductive layer, a part of a third conductive layer and a part of a fourth conductive layer are removed in a semiconductor structure according to an embodiment of the present disclosure.

As shown in FIG. 8, the second conductive region 122 is located at one side of the first gate structure 20. In a possible implementation, the first conductive region 121 may be formed in the substrate 10 by ion implantation.

Specifically, as shown in FIG. 8, the substrate 10 is of an "inverted-T-shaped" structure. The first gate structure 20 is located at one side of the first conductive region 121, and the first gate structure 20 is located on the surface of the substrate 10. The second conductive region 122 is located at one side of the first gate structure 20, and the second conductive region 122 is located in a recessed structure of the substrate 10.

In the embodiment where the first conductive region 121 is lower than the preset surface 101, for example, the substrate 10 may be of a "U-shaped" structure. The first gate structure 20 is located at one side of the first conductive region 121, and the first gate structure 20 is located on the surface of the substrate 10. The second conductive region 122 is located at one side of the first gate structure 20, and the second conductive region 122 is located in a raised structure of the substrate 10.

In the embodiment, the first conductive region 121 may be a source region of the semiconductor structure, and the second conductive region 122 may be a drain region of the semiconductor structure. Certainly, the first conductive region 121 may also be the drain region, and the second conductive region 122 may also be the source region. There are no limits made thereto in the embodiment.

When an appropriate voltage is applied to the first gate structure 20, a first conductive channel region can be formed between the first conductive region 121 and the second conductive region 122 and at a side close to the first gate structure 20 to implement the function of the semiconductor structure.

The manufacturing method of a semiconductor structure provided by the embodiment specifically includes: Provide a substrate 10. Form a first conductive region 121, the first conductive region being located on the substrate 10, and the first conductive region 121 and a preset surface 101 of the substrate 10 being located at different height positions. Form a first gate structure 20, the first gate structure being located on the preset surface 101 at one side of the first conductive region 121. Form a second conductive region 122, the second conductive region extending toward an inside of the substrate 10 from the preset surface 101 at one side of the first conductive region 121, and the projection of the first conductive region 121 on the preset surface 101 falling beyond the second conductive region 122. When an appropriate voltage is applied to the first gate structure 20, a first conductive channel region can be formed between the first conductive region 121 and the second conductive region 122 and at a side close to the first gate structure 20. As the first conductive region 121 and the second conductive region 122 are located at the different height positions, compared with a distance between the first conductive region 121 and the second conductive region 122 in a direction parallel to the surface of the substrate 10, the first channel region is longer to reduce the electric leakage of the semiconductor structure and improve the performance of the semiconductor structure.

Further, the semiconductor structure provided by the embodiment is further helpful to reduce the device size and improve the device integration, thus further improving the performance of the device.

Optionally, in the manufacturing method of a semiconductor structure provided by the embodiment, the step of forming a first conductive region 121 includes: Form a transitional conductive region 1211, the transitional conductive region extending toward the inside of the substrate from a surface of the substrate 10.

As shown in FIG. 4, the transitional conductive region 1211 is formed in the substrate 10, and extends toward the inside of the substrate from the surface of the substrate 10. In a possible implementation, the first conductive region 121 may be formed by implanting ions into the surface of the substrate 10. Specifically, in the embodiment where the substrate 10 includes the P-type substrate 10, N-type ions are implanted to form the transitional conductive region 1211. However, in the embodiment where the substrate 10 includes the N-type substrate 10, P-type ions are implanted to form the transitional conductive region 1211.

In the embodiment, after the transition conductive region 1211 is formed, the step of forming a first conductive region 121 further includes: Form a first mask layer, an etching pattern being provided on the first mask layer.

As shown in FIG. 5, the pattern may be transferred to the substrate 10 by photoetching. The first mask layer includes a first hard mask layer 61 covering the substrate 10 and a first photoresist layer 62 covering the first hard mask layer 61. The first photoresist layer 62 is formed into the etching pattern by the photoetching. Thereafter, the first hard mask layer 61 corresponding to the etching pattern is retained by etching to transfer the etching pattern to the first hard mask layer 61 conveniently. That is, the etching pattern is provided on the first mask layer.

In the embodiment, after the first mask layer is formed, the step of forming a first conductive region 121 further includes: Remove a part of the substrate 10, and retain the substrate 10 corresponding to the etching pattern to form the first conductive region 121 and the preset surface 101.

The part of the substrate 10 may be removed by etching. The removed substrate 10 extends toward the inside of the substrate 10 from the surface of the substrate 10, such that the substrate 10 can be formed into the "inverted-T-shaped" structure, the transitional conductive region 1211 is etched to form the first conductive region 121 in the raised structure of the substrate 10 and the preset surface 101 is formed on the surface of the etched substrate 10. Specifically, the raised structure and the preset surface 101 are connected through a rounded corner to facilitate uniform distribution of the subsequent film layer.

Figure 9:
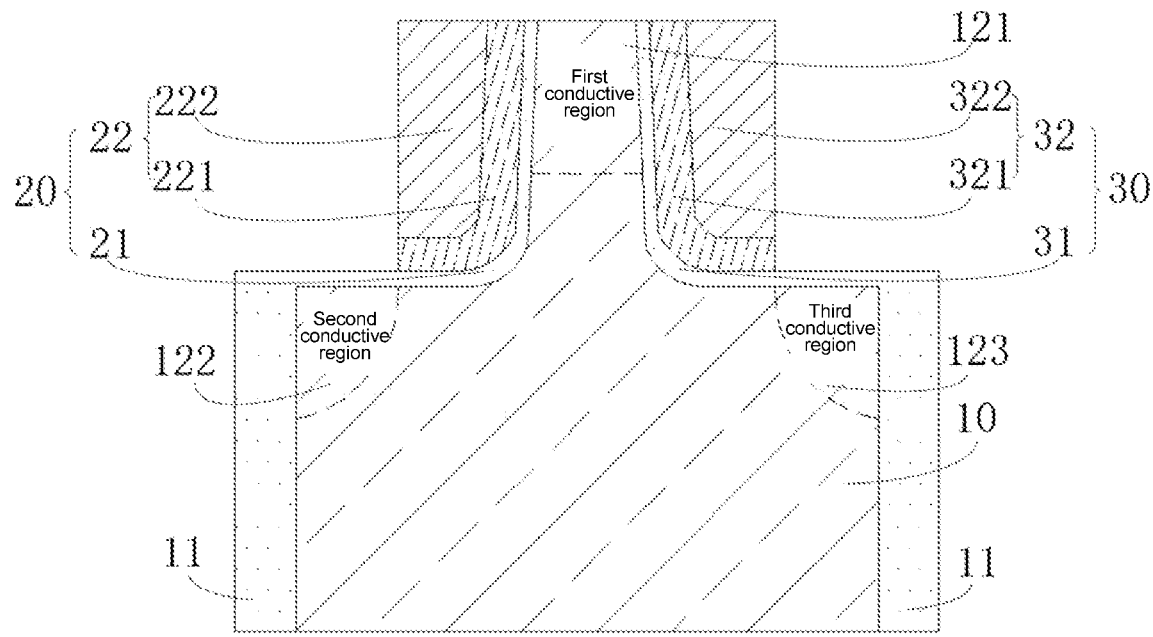
FIG. 9 is a schematic cross-sectional view of a first gate conductor block and a second gate conductor block in a semiconductor structure according to an embodiment of the present disclosure.

It is to be noted that the first gate structure 20 and the second conductive region 122 are located at a left side of the first conductive region 121, as shown in FIG. 8 and FIG. 9. The first gate structure 20, the first conductive region 121, the second conductive region 122 and the substrate 10 can be formed into a transistor structure. To further improve the integration of the semiconductor structure, a structure symmetric with respect to the first conductive region 121 may further be provided at a right side of the first conductive region 121 to form another transistor structure. In this case, the transmission efficiency of the semiconductor structure and the performance of the semiconductor structure can further be improved.

Optionally, after forming the first conductive region 121, the manufacturing method of a semiconductor structure provided by the embodiment further includes: Form a second gate structure 30, the second gate structure being located on the preset surface 101 at the other side of the first conductive region 121.

The second gate structure 30 is located on the preset surface 101. The second gate structure 30 includes a conductive layer. The conductive layer may include one or more conductive materials. The conductive layer is connected to an externally applied voltage to turn on or off the semiconductor structure. The second gate structure 30 further includes an insulating material for protecting the second gate structure 30 from damage.

After forming the second gate structure 30, the manufacturing method of a semiconductor structure further includes: Form a third conductive region 123, the third conductive region 123 extending toward the inside of the substrate 10 from the preset surface 101 at the other side of the first conductive region 121, and the projection of the first conductive region 121 on the preset surface 101 falling beyond the third conductive region 123.

Specifically, as shown in FIG. 8, the substrate 10 is of an "inverted-T-shaped" structure. The first gate structure 20 is located at one side of the first conductive region 121, and the second gate structure 30 is located at the other side of the first conductive region 121. The second conductive region 122 is located at one side of the first gate structure 20, and the second conductive region 122 is located in a left recessed structure of the substrate 10. The third conductive region 123 is located at one side of the second gate structure 30, and the third conductive region 123 is located in a right recessed structure of the substrate 10.

In the embodiment where the first conductive region 121 is lower than the preset surface 101, for example, the substrate 10 may be of a "U-shaped" structure. The first gate structure 20 is located at one side of the first conductive region 121, and the second gate structure 30 is located at the other side of the first conductive region 121. The second conductive region 122 is located at one side of the first gate structure 20, and the second conductive region 122 is located in a left raised structure of the substrate 10. The third conductive region 123 is located at one side of the second gate structure 30, and the third conductive region 123 is located in a right raised structure of the substrate 10.

In the embodiment, the first conductive region 121 may be a source region of the semiconductor structure, and the second conductive region 122 and the third conductive region 123 each may be a drain region of the semiconductor structure. Certainly, the first conductive region 121 may also be the drain region, and the second conductive region 122 and the third conductive region 123 each may also be the source region. There are no limits made thereto in the embodiment.

When an appropriate voltage is applied to the second gate structure 30, a second conductive channel region can be formed between the first conductive region 121 and the third conductive region 123 and at a side close to the second gate structure 30 to implement the function of the semiconductor structure.

It is to be understood by those skilled in the art that the first gate structure 20 and the second gate structure 30 may be formed synchronously, and the second conductive region 122 and the third conductive region 123 may be formed synchronously, so as to improve the manufacturing efficiency and reduce the manufacturing cost.

Optionally, in the manufacturing method of a semiconductor structure provided by the embodiment, the step of forming a first gate structure 20 includes: Form a first gate dielectric layer 21, the first gate dielectric layer 21 covering the preset surface 101 and the first conductive region 121, and being provided with a bending structure.

Figure 7:
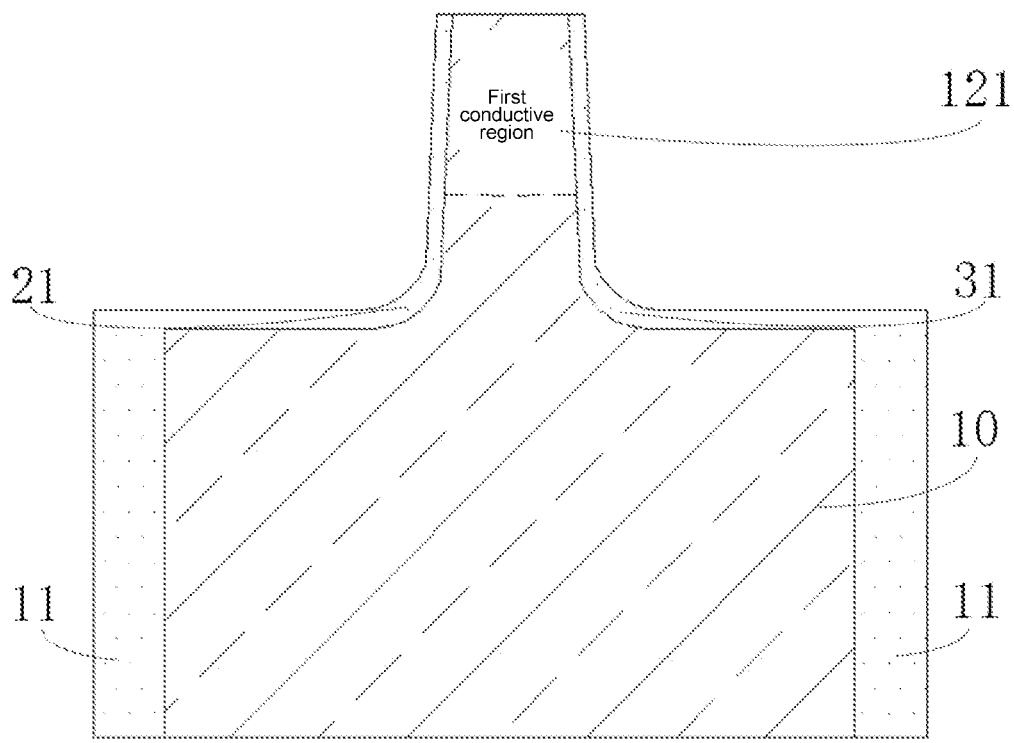
FIG. 7 is a schematic cross-sectional view of a first conductive layer, a second conductive layer, a third conductive layer and a fourth conductive layer in a semiconductor structure according to an embodiment of the present disclosure.

As shown in FIG. 7, the first gate dielectric layer 21 is configured to isolate the first gate structure 20 and the substrate 10. In a possible implementation, the first gate dielectric layer 21 may be formed by coating so as to be continuously distributed along the horizontal direction of the substrate 10 and the vertical direction of the substrate 10 and protect the first gate conductor block 22 from damage. The material of the first gate dielectric layer 21 may include, for example, silicon oxide, silicon nitride, silicon oxynitride, etc.

Optionally, a bend in the bending structure of the first gate dielectric layer 21 has a radian of greater than 90°. Exemplarily, referring to FIG. 6, the bending structure of the first gate dielectric layer 21 is provided between the surface of the substrate 10 and the raised structure. The bending structure is formed in a circular arc. A central angle corresponding to the circular arc is greater than 90° to further isolate the first channel region and the first gate conductor block 22 and further protect the first gate conductor block 22 from damage. In other examples, the bending structure may further be formed in a spline curve. A central angle corresponding to the spline curve is greater than 90°.

In this embodiment, after forming the first gate dielectric layer 21, the step of forming a first gate structure 20 further includes: Form a first gate conductor block 22, the first gate conductor block being located on the preset surface 101 at one side of the first conductive region 121.

Specifically, as shown in FIG. 8, the step of forming a first gate conductor block 22 may include: Form a first conductive layer 221, the first conductive layer covering the first gate dielectric layer 21. Form a second conductive layer 222, the second conductive layer covering the first conductive layer 221.

The material of the first conductive layer 221 may be different from that of the second conductive layer 222. In a possible implementation, the material of each of the first conductive layer 221 and the second conductive layer 222 may include, for example, titanium nitride, polycrystalline silicon, tungsten, etc.

Figure 11:
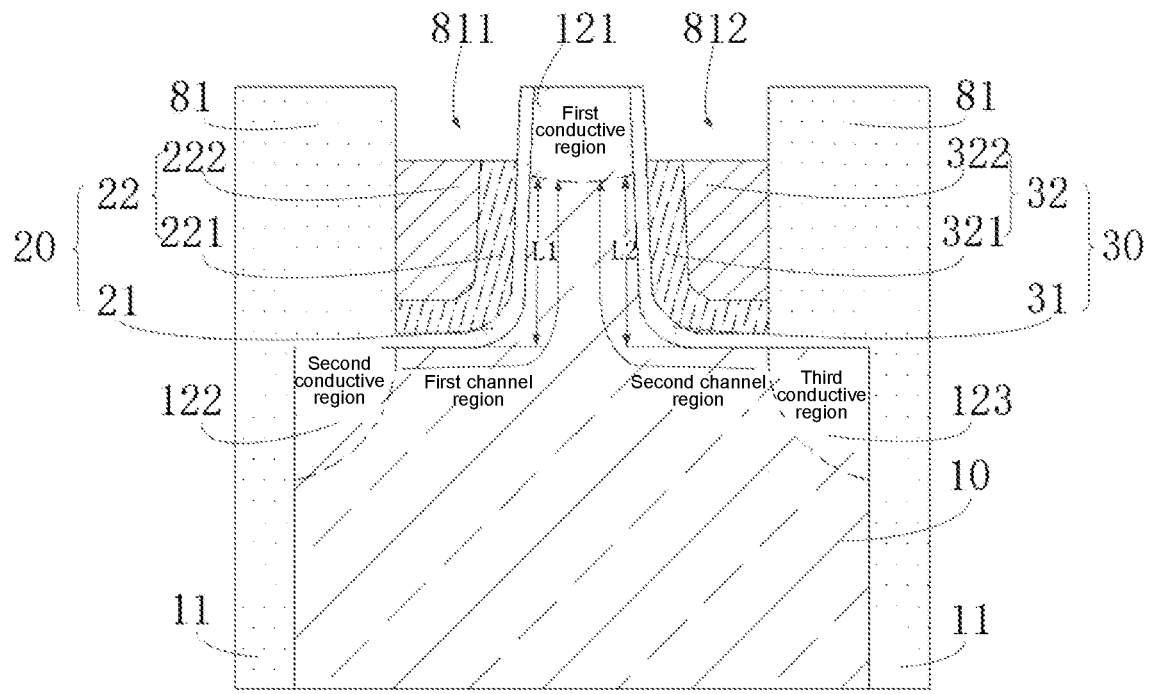
FIG. 11 is a schematic cross-sectional view of a first recess and a second recess in a semiconductor structure according to an embodiment of the present disclosure.

As shown in FIG. 8 and FIG. 11, after forming the first conductive layer 221 and the second conductive layer 222, there is a further need to remove a part of the first conductive layer 221 and a part of the second conductive layer 222 to facilitate subsequent formation of the first gate structure 20.

While the first gate structure 20 is formed, the step of forming a second gate structure 30 includes: Form a second gate dielectric layer 31, the second gate dielectric layer 31 covering the preset surface 101 and the first conductive region 121, and being provided with a bending structure.

As shown in FIG. 7, the second gate dielectric layer 31 is configured to isolate the second gate structure 30 and the substrate 10. In a possible implementation, the second gate dielectric layer 31 may be formed by coating and formed with the first gate dielectric layer 21 synchronously, so as to be continuously distributed along the horizontal direction of the substrate 10 and the vertical direction of the substrate 10 and protect the second gate conductor block 32 from damage. The material of the second gate dielectric layer 31 may include, for example, silicon oxide, silicon nitride, silicon oxynitride, etc.

Optionally, a bend in the bending structure of the second gate dielectric layer 31 has a radian of greater than 90°. Exemplarily, referring to FIG. 6, the bending structure of the second gate dielectric layer 31 is provided between the surface of the substrate 10 and the raised structure. The bending structure is formed in a circular arc. A central angle corresponding to the circular arc is greater than 90° to further isolate the second channel region and the second gate dielectric layer 31 and further protect the second gate conductor block 32 from damage. In other examples, the bending structure may further be formed in a spline curve. A central angle corresponding to the spline curve is greater than 90°.

In this embodiment, after forming the second gate dielectric layer 31, the step of forming a second gate structure 30 further includes: Form a second gate conductor block 32, the second gate conductor block being located on the preset surface 101 at the other side of the first conductive region 121.

Specifically, as shown in FIG. 8, the step of forming a second gate conductor block 32 may include: Form a third conductive layer 321, the third conductive layer covering the second gate dielectric layer 31. Form a fourth conductive layer 322, the second conductive layer covering the third conductive layer 321.

To reduce the manufacturing cost of the semiconductor structure, the material of the third conductive layer 321 may be different from that of the fourth conductive layer 322. In a possible implementation, the material of each of the third conductive layer 321 and the fourth conductive layer 322 may include, for example, titanium nitride, polycrystalline silicon, tungsten, etc.

As shown in FIG. 8 and FIG. 11, after forming the third conductive layer 321 and the fourth conductive layer 322, there is a further need to remove a part of the third conductive layer 321 and a part of the fourth conductive layer 322 to facilitate subsequent formation of the second gate structure 30.

In an embodiment, the first conductive layer 221 and the third conductive layer 321 may be formed synchronously, while the second conductive layer 222 and the fourth conductive layer 322 may be formed synchronously, thereby improving the manufacturing efficiency and reducing the manufacturing cost.

As shown in FIG. 8 and FIG. 9, after forming the first conductive layer 221, the third conductive layer 321, the second conductive layer 222 and the fourth conductive layer 322, an end of each of the first conductive layer 221 and the second conductive layer 222 away from the first conductive region 121 is removed to form the second conductive region 122, and an end of each of the third conductive layer 321 and the fourth conductive layer 322 away from the first conductive region 121 is removed to form the third conductive region 123.

Specifically, on the first conductive layer 221, the third conductive layer 321, the second conductive layer 222 and the fourth conductive layer 322, there may be a second hard mask layer 71 and a second photoresist layer 72 that are stacked. The second photoresist layer 72 is formed into the etching pattern by the photoetching. Thereafter, the second hard mask layer 71 corresponding to the etching pattern is retained by etching to transfer the etching pattern to the second hard mask layer 71 conveniently. A part of the first conductive layer 221, a part of the third conductive layer 321, a part of the second conductive layer 222 and a part of the fourth conductive layer 322 are removed, and parts corresponding to the etching pattern are retained to form the first gate structure 20 and the second gate structure 30.

Further, in the embodiment, the second conductive region 122 and the third conductive region 123 may be formed synchronously, so as to improve the manufacturing efficiency and reduce the manufacturing cost.

Optionally, in the manufacturing method of a semiconductor structure provided by the embodiment, the step of forming a second conductive region 122 includes: Form a second mask layer, a first hole being formed in the second mask layer.

The preset surface 101 at a side of the first gate structure 20 away from the first conductive region 121 is exposed through the first hole, so as to form the second conductive region 122 conveniently at the side of the first gate structure 20 away from the first conductive region 121.

After forming the second mask layer, the step of forming a second conductive region 122 further includes: Implant first ions, such that the second conductive region 122 is formed in the substrate 10 corresponding to the first hole. Specifically, the second conductive region 122 extends toward the inside of the substrate 10 from the preset surface 101.

Optionally, in the manufacturing method of a semiconductor structure provided by the embodiment, the step of forming a third conductive region 123 includes: Form a second mask layer, a second hole being formed in the second mask layer.

In order to form the second conductive region 122 and the third conductive region 123 simultaneously, while the first hole is formed in one end of the second mask layer, the second hole may be formed in the other end of the second mask layer. The preset surface 101 at a side of the second gate structure 30 away from the first conductive region 121 is exposed through the second hole, so as to form the third conductive region 123 conveniently at the side of the second gate structure 30 away from the first conductive region 121.

After forming the second mask layer, the step of forming a third conductive region 123 further includes: Implant second ions, such that the third conductive region 123 is formed in the substrate 10 corresponding to the second hole.

Specifically, in the embodiment where the substrate 10 includes the P-type substrate 10, the implanted first ions and second ions are the N-type ions to form the second conductive region 122 and the third conductive region 123. In the embodiment where the substrate 10 includes the N-type substrate 10, the implanted first ions and second ions are the P-type ions to form the second conductive region 122 and the third conductive region 123.

Optionally, after forming the second conductive region 122, the manufacturing method of a semiconductor structure provided by the embodiment further includes: Form an isolation layer, the isolation layer covering the first conductive region 121, the first gate structure 20 and the preset surface 101.

Specifically, the step of forming an isolation layer includes: Form a first isolation layer 81, the first isolation layer covering the first gate structure 20 and the preset surface 101 out of the first conductive region 121.

Figure 10:
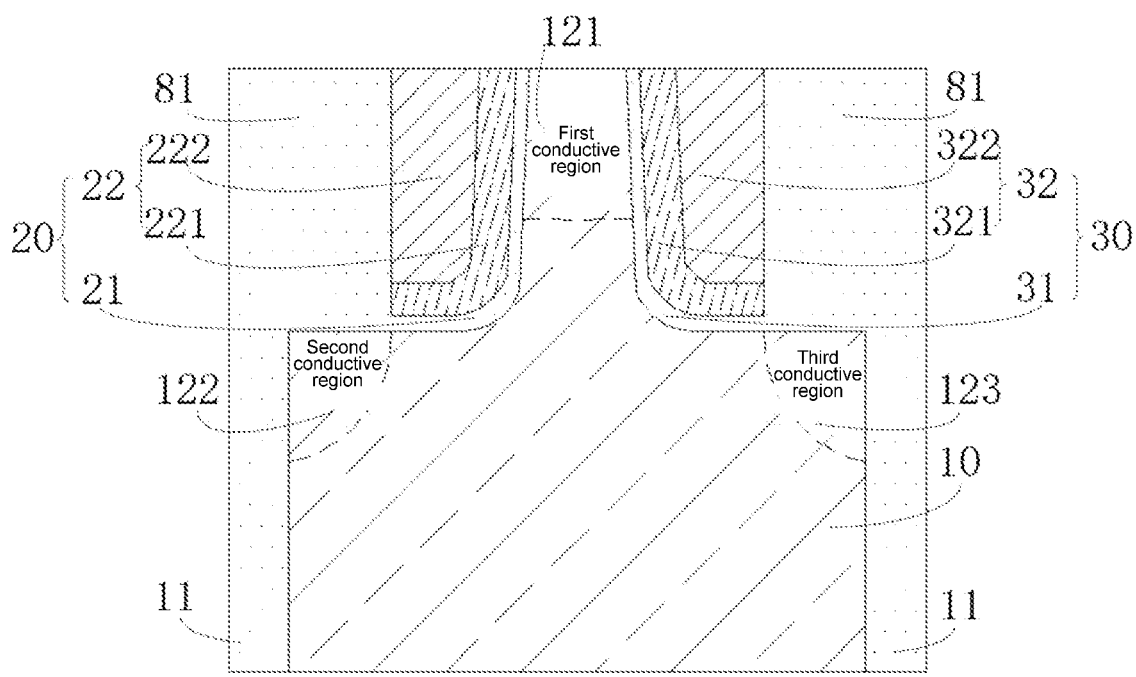
FIG. 10 is a schematic cross-sectional view of a first isolation layer in a semiconductor structure according to an embodiment of the present disclosure.

Exemplarily, as shown in FIG. 10, an end of the first isolation layer 81 away from the preset surface 101 is flush with the first gate structure 20 and the first conductive region 121. In a possible implementation, the material of the first isolation layer 81 may be the same as that of the first gate dielectric layer 21 to further reduce the manufacturing cost.

Optionally, after forming the first isolation layer 81, the step of forming an isolation layer further includes: Remove a part of the first gate structure 20 to form a first recess 811 extending toward the substrate 10. After the part of the first gate structure 20 is removed, the first gate structure 20 may be located between the first conductive region 121 and the second conductive region 122, such that the first channel region is formed between the first conductive region 121 and the second conductive region 122 and at the side close to the first gate structure 20.

Optionally, the first channel region between the first conductive region 121 and the second conductive region 122 and at the side close to the first gate structure 20 is provided with a bending structure.

Exemplarily, referring to FIG. 11, the first channel region includes a horizontal structure in a direction parallel to the surface of the substrate 10 and a vertical structure in a direction perpendicular to the surface of the substrate 10. The first channel region further includes a bending structure between the horizontal part and the vertical part. With the bending structure in the first channel region, the first channel region is further longer to reduce the electric leakage of the semiconductor structure.

Optionally, a height difference L1 is formed between the first conductive region 121 and the second conductive region 122, and an absolute value of the height difference L1 is greater than zero and less than a length of the first channel region.

Exemplarily, as shown in the figure, the absolute value of the height difference L1 is a length of the vertical structure in the direction perpendicular to the surface of the substrate 10. In the embodiment where the position of the first conductive region 121 on the surface of the substrate 10 is lower than the position of the second conductive region 122 on the surface of the substrate 10, the absolute value of the height difference L1 is the length of the vertical structure in the direction perpendicular to the surface of the substrate 10. The length of the first channel region is a sum of the length of the horizontal structure, the length of the vertical structure and the length of the bending structure. Therefore, the absolute value of the height difference is greater than zero and less than the length of the first channel region in the above two semiconductor structures.

Optionally, after the part of the first gate structure 20 is removed to form the first recess 811 extending toward the substrate 10, the step of forming an isolation layer further includes: Form a second isolation layer 82, the second isolation layer 82 covering the first isolation layer 81 and the first conductive region 121, and filling the first recess 811.

In a possible implementation, the material of the second isolation layer 82 may be the same as that of the first isolation layer 81 and that of the first gate dielectric layer 21 to further reduce the manufacturing cost.

Further, in the embodiment, the isolation layer further covers the second gate structure 30, so as to improve the manufacturing efficiency and reduce the manufacturing cost.

In the embodiment, the step of forming an isolation layer includes: Form a first isolation layer 81, the first isolation layer covering the second gate structure 30 and the preset surface 101 out of the third conductive region 123.

In the embodiment, after forming the first isolation layer 81, while the part of the first gate structure 20 is removed, a part of the second gate structure 30 is removed to form a second recess 812 extending toward the substrate 10. After the part of the second gate structure 30 is removed, the second gate structure 30 may be located between the first conductive region 121 and the third conductive region 123, such that the second channel region is formed between the first conductive region 121 and the third conductive region 123 and at the side close to the second gate structure 30. Further, a bottom of the first recess 811 is flush with a bottom of the second recess 812 to obtain the more regular semiconductor structure and improve the performance of the semiconductor structure.

Optionally, the second channel region between the first conductive region 121 and the third conductive region 123 and at the side close to the second gate structure 30 is provided with a bending structure.

Exemplarily, referring to FIG. 11, the second channel region includes a horizontal structure in a direction parallel to the surface of the substrate 10 and a vertical structure in a direction perpendicular to the surface of the substrate 10. The second channel region further includes a bending structure between the horizontal part and the vertical part. With the bending structure in the second channel region, the second channel region is further longer to reduce the electric leakage of the semiconductor structure.

Optionally, a height difference L2 is formed between the first conductive region 121 and the third conductive region 123, and an absolute value of the height difference L2 is greater than zero and less than a length of the second channel region.

Exemplarily, as shown in the figure, the absolute value of the height difference L2 is a length of the vertical structure in the direction perpendicular to the surface of the substrate 10. In the embodiment where the position of the first conductive region 121 on the surface of the substrate 10 is lower than the position of the third conductive region 123 on the surface of the substrate 10, the absolute value of the height difference L2 is the length of the vertical structure in the direction perpendicular to the surface of the substrate 10. The length of the second channel region is a sum of the length of the horizontal structure, the length of the vertical structure and the length of the bending structure. Therefore, the absolute value of the height difference is greater than zero and less than the length of the second channel region in the above two semiconductor structures.

Optionally, after the part of the second gate structure 30 is removed to form the second recess 812 extending toward the substrate 10, the step of forming an isolation layer further includes: Form a second isolation layer 82, the second isolation layer 82 covering the first isolation layer 81 and the first conductive region 121, and filling the second recess 812.

Figure 12:
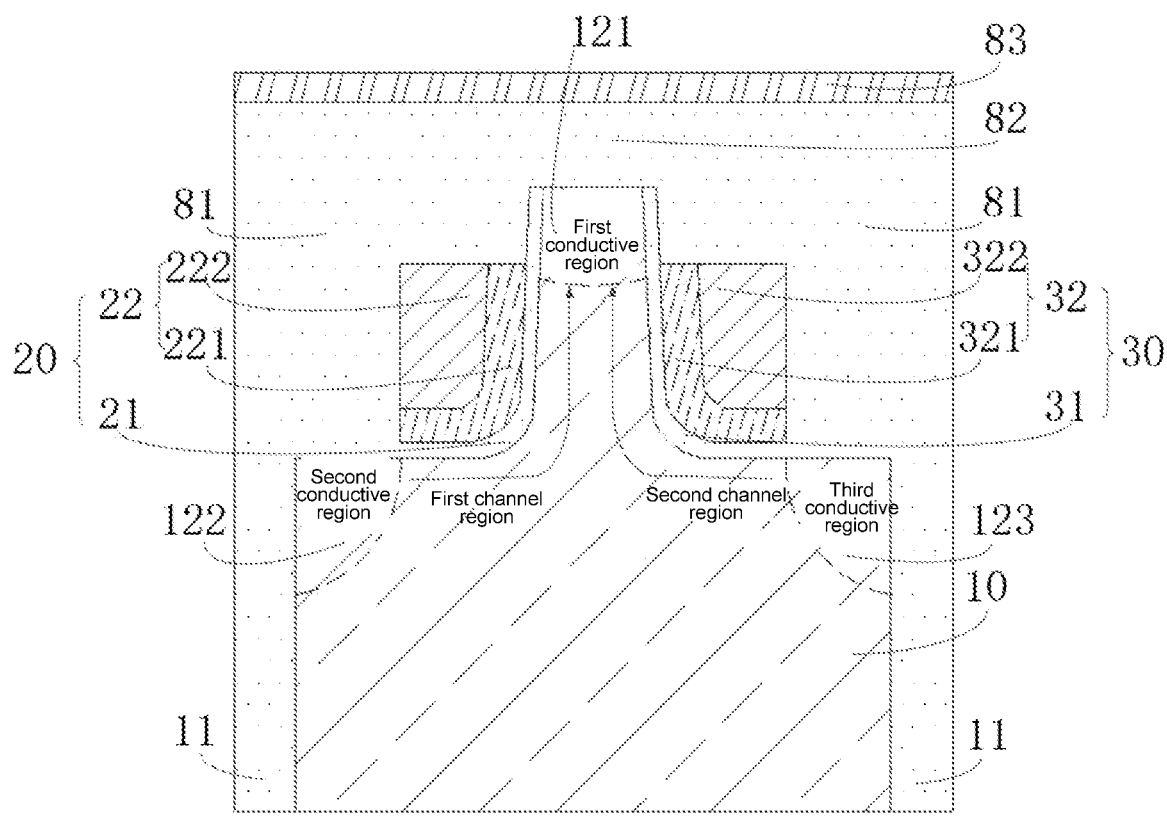
FIG. 12 is a schematic cross-sectional view of a second isolation layer and a third isolation layer in a semiconductor structure according to an embodiment of the present disclosure.

Referring to FIG. 12, it to be noted that the isolation layer may further a third isolation layer 83. After forming the second isolation layer 82, the third isolation layer 83 may further be formed on the second isolation layer 82, the third isolation layer 83 covering the second isolation layer 82. In a possible implementation, the material of the third isolation layer 83 may include silicon nitride, silicon oxide, silicon oxynitride, etc.

In the embodiment, after forming the isolation layer, a conductive plug is further formed. Specifically, a first plug 511, a second plug 521 and a third plug 522 are formed, the first plug, the second plug and the third plug penetrating through the isolation layer and extending to the first conductive region 121, the second conductive region 122 and the first gate structure 20. The first conductive region 121, the second conductive region 122 and the first gate structure 20 are electrically connected through the first plug 511, the second plug 521 and the third plug 522, such that the first gate structure 20, the first conductive region 121 and the second conductive region 122 transmit the electrical signal through the first plug 511, the second plug 521 and the third plug 522 to implement the function of the semiconductor structure.

In the embodiment, while the first plug 511, the second plug 521 and the third plug 522 are formed, a fourth plug 512 and a fifth plug 523 are further formed synchronously, the fourth plug and the fifth plug penetrating through the isolation layer and extending to the second gate structure 30 and the third conductive region 123. The second gate structure 30 and the third conductive region 123 are electrically connected through the fourth plug 512 and the fifth plug 523, such that the second gate structure 30 and the third conductive region 123 transmit the electrical signal through the fourth plug 512 and the fifth plug 523 to implement the function of the semiconductor structure.

Figure 13:
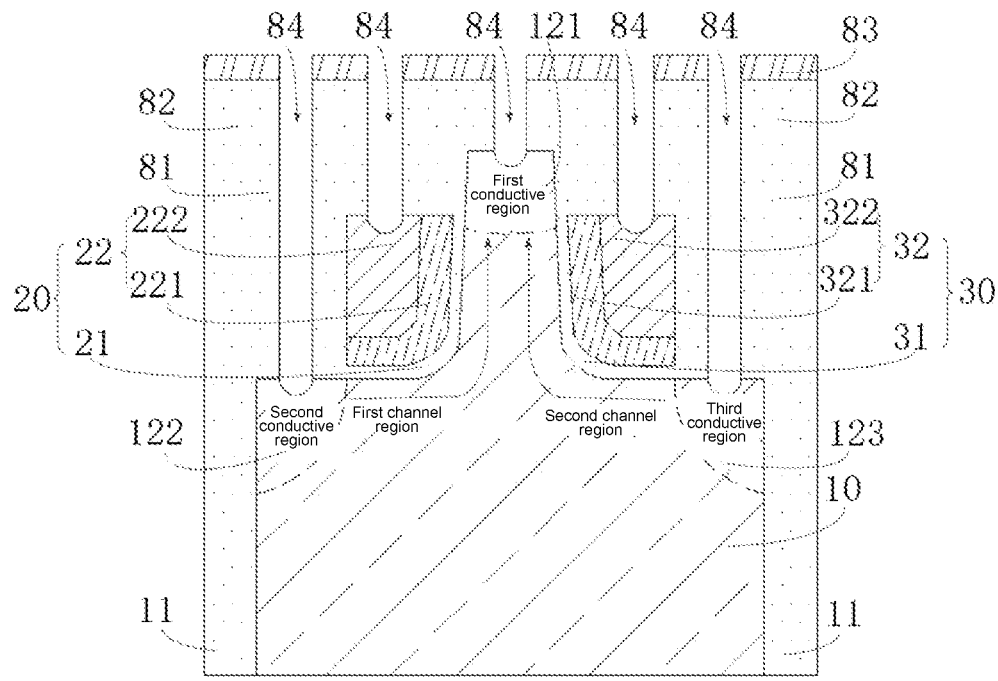
FIG. 13 is a schematic cross-sectional view of a contact hole in a semiconductor structure according to an embodiment of the present disclosure.
Figure 14:
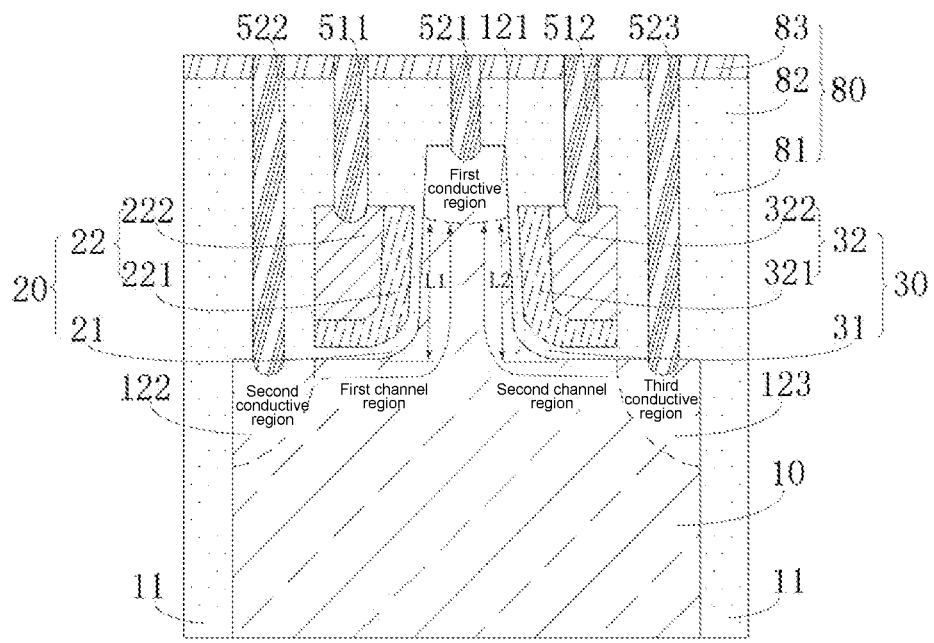
FIG. 14 is a schematic cross-sectional view of a first plug, a second plug, a third plug, a fourth plug and a fifth plug in a semiconductor structure according to an embodiment of the present disclosure.

As shown in FIG. 13 and FIG. 14, specifically, while the first plug 511, the second plug 521, the third plug 522, the fourth plug 512 and the fifth plug 523 are formed, a plurality of contact holes 84 may be formed in the isolation layer by etching in a penetrating manner. Bottoms of the contact holes 84 are located in the first conductive region 121, the second conductive region 122, the first gate structure 20, the second gate structure 30 and the third conductive region 123 separately. A conductive material is filled in the contact holes 84 to form the above plugs.

Those skilled in the art can clearly understand that, for convenience and brevity of description, the division of the foregoing functional modules is merely an example for description. In practical application, the functions may be assigned to and completed by different functional modules as required. That is, the internal structure of the apparatus is divided into different functional modules, to complete all or some of the functions described above. Reference may be made to the corresponding process in the foregoing method embodiments for the specific working process of the foregoing apparatus. Details are not described herein again.

Finally, it is to be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

The invention claimed is:

1. A semiconductor structure, comprising:
a first gate structure on a substrate, a first conductive region and a second conductive region, wherein the first conductive region and the second conductive region are located at two sides of the first gate structure, and in a direction perpendicular to the substrate, the first conductive region and the second conductive region are located at different height positions; and
a second gate structure on the substrate and a third conductive region, wherein the first conductive region and the third conductive region are located at two sides of the second gate structure, and in the direction perpendicular to the substrate, the third conductive region and the first conductive region are located at different height positions; and
wherein the substrate is of a U-shaped structure, a position of the first conductive region on a surface of the substrate is lower than a position of the second conductive region on a surface of the substrate, and the position of the first conductive region on the surface of the substrate is lower than a position of the third conductive region on a surface of the substrate.

2. The semiconductor structure according to claim 1, wherein a first channel region is formed between the first conductive region and the second conductive region and at a side close to the first gate structure, and the first channel region is provided with a bending structure.

3. The semiconductor structure according to claim 2, wherein there is a height difference between the first conductive region and the second conductive region, and an absolute value of the height difference between the first conductive region and the second conductive region is greater than zero and less than a length of the first channel region.

4. The semiconductor structure according to claim 1, wherein the first gate structure comprises a first gate conductor block and a first gate dielectric layer, the first gate dielectric layer is located between the first gate structure and the substrate, and the first gate dielectric layer is provided with a bending structure.

5. The semiconductor structure according to claim 4, wherein the first gate dielectric layer is distributed along a horizontal direction of the substrate and a vertical direction of the substrate, and the first gate dielectric layer is distributed continuously.

6. The semiconductor structure according to claim 1, wherein a second channel region is formed between the third conductive region and the first conductive region and at a side close to the second gate structure, and the second channel region is provided with a bending structure.

7. The semiconductor structure according to claim 6, wherein there is a height difference between the third conductive region and the first conductive region, and an absolute value of the height difference between the third conductive region and the first conductive region is greater than zero and less than a length of the second channel region.

8. The semiconductor structure according to claim 1, wherein the second gate structure comprises a second gate conductor block and a second gate dielectric layer, the second gate dielectric layer is located between the second gate structure and the substrate, and the second gate dielectric layer is provided with a bending structure.

9. The semiconductor structure according to claim 8, wherein the second gate dielectric layer is distributed along a horizontal direction of the substrate and a vertical direction of the substrate, and the second gate dielectric layer is distributed continuously.

10. The semiconductor structure according to claim 1, wherein in the direction perpendicular to the substrate, the first gate structure, the first conductive region, the second conductive region, the second gate, and the third conductive region are electrically connected through a first plug, a second plug, a third plug, a fourth plug, and a fifth plug, respectively; wherein the third plug penetrates into the second conductive region, and the fifth plug penetrates into the third conductive region.

* * * * *